(12) United States Patent
Fulford et al.

(10) Patent No.: US 11,552,080 B2
(45) Date of Patent: Jan. 10, 2023

(54) METHOD OF MAKING MULTIPLE NANO LAYER TRANSISTORS TO ENHANCE A MULTIPLE STACK CFET PERFORMANCE

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 8 days.

(21) Appl. No.: 17/381,384

(22) Filed: Jul. 21, 2021

(65) Prior Publication Data

US 2021/0351180 A1   Nov. 11, 2021

Related U.S. Application Data

(62) Division of application No. 16/592,519, filed on Oct. 3, 2019, now Pat. No. 11,133,310.

(51) Int. Cl.
  *H01L 21/00* (2006.01)
  *H01L 27/092* (2006.01)
  (Continued)

(52) U.S. Cl.
  CPC ...... *H01L 27/0924* (2013.01); *H01L 21/8221* (2013.01); *H01L 21/8258* (2013.01);
  (Continued)

(58) Field of Classification Search
  CPC ............. H01L 27/0924; H01L 21/8221; H01L 21/823807
  See application file for complete search history.

(56) References Cited

U.S. PATENT DOCUMENTS 7,569,491 B2 * 8/2009 Faguet ............... C23C 16/045
  216/99
10,249,498 B2 * 4/2019 Ventzek ............. H01L 21/2236
  (Continued)

FOREIGN PATENT DOCUMENTS

CN   113964123 A * 1/2022 ......... H01L 27/1108
CN   114514608 A * 5/2022 ............. B82Y 10/00
  (Continued)

OTHER PUBLICATIONS

International Search Report and Written Opinion dated Nov. 30, 2020 in PCT/US2020/046751, 11 pages.

*Primary Examiner* — Laura M Menz
(74) *Attorney, Agent, or Firm* — Oblon, McClelland, Maier & Neustadt, L.L.P.

(57) ABSTRACT

In a method of forming a semiconductor device, an epitaxial layer stack is formed over a substrate. The epitaxial layer stack includes intermediate layers, one or more first nano layers and one or more second nano layers positioned below the one or more first nano layers. Trenches are formed in the epitaxial layer stack to separate the epitaxial layer stack into sub-stacks, the one of more first nano layers into first nano-channels, and the one or more second nano layers into second nano-channels. The intermediate layers are recessed so that one or more first nano-channels of the first nano-channels and one or more second nano-channels of the second nano-channels in each of the sub-stacks protrude from sidewalls of the intermediate layers. Bottom source/drain (S/D) regions are formed in the trenches to connect the second nano-channels. Top S/D regions are formed in the trenches to connect the first nano-channels.

14 Claims, 9 Drawing Sheets

(51) Int. Cl.
*H01L 21/822* (2006.01)
*H01L 21/8238* (2006.01)
*H01L 21/8258* (2006.01)

(52) U.S. Cl.
CPC ............... *H01L 21/823807* (2013.01); *H01L 21/823821* (2013.01)

(56) References Cited

U.S. PATENT DOCUMENTS

| | | | |
|---|---|---|---|
| 11,133,310 B2* | 9/2021 | Fulford | H01L 27/0688 |
| 11,195,832 B2* | 12/2021 | Gardner | H01L 29/78696 |
| 11,282,828 B2* | 3/2022 | Gardner | H01L 21/8221 |
| 11,348,921 B2* | 5/2022 | Chen | H01L 27/0688 |
| 11,362,091 B2* | 6/2022 | Fulford | H01L 27/0886 |
| 2008/0053955 A1* | 3/2008 | Faguet | C23C 16/045 |
| | | | 216/39 |
| 2008/0057192 A1* | 3/2008 | Faguet | B81C 1/00071 |
| | | | 427/237 |
| 2014/0197377 A1* | 7/2014 | Kim | H01L 21/823828 |
| | | | 257/29 |
| 2017/0133462 A1 | 5/2017 | Kuhn et al. | |
| 2017/0229555 A1 | 8/2017 | Balakrishnan et al. | |
| 2019/0057867 A1* | 2/2019 | Smith | H01L 29/0669 |
| 2019/0131394 A1* | 5/2019 | Reznicek | H01L 27/1203 |
| 2019/0172755 A1 | 6/2019 | Smith | |
| 2019/0172828 A1 | 6/2019 | Smith | |
| 2019/0319095 A1* | 10/2019 | Zhang | H01L 21/823878 |
| 2020/0075593 A1* | 3/2020 | Xiao | H01L 29/66431 |
| 2020/0411518 A1* | 12/2020 | Fulford | H01L 21/823821 |
| 2021/0013111 A1* | 1/2021 | Smith | H01L 27/0922 |
| 2021/0013326 A1* | 1/2021 | Gardner | H01L 21/823462 |
| 2021/0104522 A1* | 4/2021 | Gardner | H01L 29/78696 |
| 2021/0104523 A1* | 4/2021 | Fulford | H01L 27/092 |
| 2021/0111258 A1* | 4/2021 | Fulford | H01L 29/785 |
| 2021/0118879 A1* | 4/2021 | Gardner | H01L 29/792 |
| 2021/0143065 A1* | 5/2021 | Gardner | H01L 27/092 |
| 2021/0175128 A1* | 6/2021 | Gardner | H01L 27/0688 |
| 2021/0202499 A1* | 7/2021 | Gardner | H01L 27/0688 |
| 2021/0257499 A1* | 8/2021 | Shin | H01L 29/401 |
| 2021/0313327 A1* | 10/2021 | Gardner | H01L 29/66742 |
| 2021/0320035 A1* | 10/2021 | Xie | H01L 21/3065 |
| 2021/0351180 A1* | 11/2021 | Fulford | H01L 29/161 |
| 2022/0020744 A1* | 1/2022 | Gardner | H01L 29/24 |
| 2022/0037320 A1* | 2/2022 | Chen | H01L 21/823807 |
| 2022/0077003 A1* | 3/2022 | Gardner | H01L 21/823807 |

FOREIGN PATENT DOCUMENTS

| | | | | |
|---|---|---|---|---|
| KR | 10-2017-0102660 A | | 9/2017 | |
| WO | WO-2020065732 A1 | * | 4/2020 | ........ H01L 27/1104 |
| WO | WO-2020263557 A1 | * | 12/2020 | ........ H01L 21/8221 |
| WO | WO-2021007536 A1 | * | 1/2021 | ..... H01L 21/823821 |
| WO | WO-2021066947 A1 | * | 4/2021 | ........ H01L 21/8221 |
| WO | WO-2021066951 A1 | * | 4/2021 | ............ B82Y 10/00 |
| WO | WO-2021076230 A1 | * | 4/2021 | ........ H01L 21/8221 |

* cited by examiner

METHOD OF MAKING MULTIPLE NANO LAYER TRANSISTORS TO ENHANCE A MULTIPLE STACK CFET PERFORMANCE

CROSS REFERENCE TO RELATED APPLICATIONS

This application is a divisional of U.S. patent application Ser. No. 16/592,519 filed on Oct. 3, 2019, the contents of which are hereby incorporated by reference.

FIELD OF THE INVENTION

The disclosure is related to making 3D transistors using multiple selective nano-channels for fabrication in different device regions (e.g., NMOS, PMOS). By changing the nano-channel material construction, the transistor performance can be increased. For a p-type transistor, a SiGe channel can improve the mobility and thus the on current can increase at the same off current. The SiGe channel can also help to control the short channel effect (SCE).

BACKGROUND

During manufacture of a semiconductor device, various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. Fabrication of 3D semiconductor devices poses many new and unique challenges associated with scaling, post-fabrication processing, as well as other aspects of the 3D fabrication process.

SUMMARY

In the present disclosure, complementary field-effect transistor (CFET) devices are provided. The CFET devices are three-dimensionally stacked logic transistor in which either the NMOS or PMOS transistor is situate overtop its complement. The NMOS or PMOS transistor can have a channel region that includes one or more nanowires or nano sheets. The nanowires or nano sheets can be spaced apart from one another and formed laterally along a substrate. The NMOS or PMOS transistor can have source/drain regions that are positioned at two ends of the nanowires or nano sheets. A gate structure can be formed to surround the channel regions of the NMOS and PMOS.

As functional scaling is ever decreasing the size of nanowires and/or nano sheets to enable area scaling, a significant challenge lies within the drive current of a given device. Drive current can be improved, and control in complementary field-effect transition (CFET) devices can be improved through incorporation of different materials in the NMOS and PMOS channels to provide needed strain on the nanowire and/or nano sheets.

Techniques herein provide cell architecture, design concept, and corresponding methods of manufacture for complementary FET (field effect transistor) devices that have different materials in the NMOS and PMOS channels to provide needed strain on the nanowires and/or nano sheets.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The device has a first transistor pair formed over a substrate. The first transistor pair includes a n-type transistor and a p-type transistor that are stacked over one another. The n-type transistor has a first channel region that includes one or more first nano-channels made of a first material with a first stress. The one or more first nano-channels extend laterally along the substrate, are stacked over the substrate and spaced apart from one another. The p-type transistor has a second channel region that includes one or more second nano-channels made of a second material with a second stress. The one or more second nano-channels extend laterally along the substrate, are stacked over the substrate and spaced apart from one another. Each of the one or more first nano-channels in the first channel region and each of the one or more second nano-channels in the second channel region are surrounded by a gate structure respectively.

In some embodiments, the first stress is a tensile stress and the second stress is a compressive stress. In some embodiments, the first material includes at least one of silicon or silicon carbide that has a carbon content between 2% and 20%, and the second material includes at least one of silicon or SiGe that has a Ge content between 5% and 30%.

In some embodiments, the one or more first nano-channels can have a number N of first nano-channels, where the N is an integer from one to ten. Similarly, the one or more second nano-channels can include a number M of second nano-channels, where the M can be an integer from one to ten. The nano-channel herein means either a nano wire of a nano sheet shaped channel for a field effect transistor.

In the disclosed device, the n-type transistor further includes a first source/drain (S/D) region and a second S/D region that are made of silicon doped with phosphorous. The first S/D region and the second S/D region of the n-type transistor are positioned at two ends of the one or more first nano-channels and in direct contact with the one or more first nano-channels. In addition, the p-type transistor further includes a first source/drain (S/D) region and a second S/D region that are made of silicon doped with boron. The first S/D region and the second S/D region of the p-type transistor are positioned at two ends of the one or more second nano-channels and in direct contact with the one or more second nano-channels.

In some embodiments, the n-type transistor is stacked over the p-type transistor. In some embodiments, the p-type transistor is sacked over the n-type transistor.

The device can have a second transistor pair formed over the substrate. The second transistor includes a n-type transistor and a p-type transistor. The second transistor pair is positioned at a first side of the first transistor pair. A n-channel region of the n-type transistor of the second transistor pair is coupled to a first S/D region of the n-type transistor of the first transistor pair, and a p-channel region of the p-type transistor of the second transistor pair is coupled to a first S/D region of the p-type transistor of the first transistor pair. The device can further have a third transistor pair formed over the substrate. The third transistor pair includes a n-type transistor and a p-type transistor. The third transistor pair can be positioned at a second side of the first transistor pair. A n-channel region of the n-type transistor of the third transistor pair is coupled to a second S/D region of the n-type transistor of the first transistor pair, and a p-type channel region of the p-type transistor of the third transistor pair is coupled to a second S/D region of the p-type transistor of the first transistor pair.

According to another aspect of the disclosure, a method for forming a semiconductor is provided. In the disclosed method, an epitaxial layer stack over a substrate is formed. The epitaxial layer stack includes a plurality of intermediate layers, one or more first nano layers with a first stress and one or more second nano layers with a second stress. The one or more first nano layers are positioned over the one or more second nano layers and spaced apart from the one or more second nano layers by one or more of the plurality of intermediate layers. The one or more first nano layers are made of a first material and spaced apart from one another by one or more of the plurality of intermediate layers. The one or more second nano layers are made of a second material and spaced apart from one another by one or more of the plurality of intermediate layers.

In the disclosed method, a plurality of trenches can be subsequently formed in the epitaxial layer stack. The epitaxial layer stack can be separated into a plurality of sub-stacks by the plurality of trenches so that the one or more first nano layers are separated into a plurality of first nano-channels, the one or more second nano layers are separated into a plurality of second nano-channels, and each of the plurality of sub-stacks includes one or more first nano-channels and one or more second nano-channels. Further, the plurality of intermediate layers can be recessed so that the one or more first nano-channels and the one or more second nano-channels in each of the plurality of sub-stacks protrude from sidewalls of the plurality of intermediate layers. A plurality of bottom source/drain (S/D) regions can then be formed in the plurality of trenches. The plurality of bottom S/D regions are in direct contact with the plurality of second nano-channels. Over the plurality of bottom S/D regions, a plurality of top source/drain (S/D) regions can be formed in the plurality of trenches. The plurality of bottom S/D regions are in direct contact with the plurality of first nano-channels.

In some embodiments, the plurality of intermediate layers includes a bottom layer that is positioned on the substrate and made of first SiGe, and a plurality of upper layers that are positioned over the bottom layer, and made of a second SiGe. The first SiGe can have a first Ge content between 80% and 100% and the second SiGe can have a second Ge content between 60% and 80%.

In some embodiments, the first material includes at least one of silicon or silicon carbide that has a carbon content between 2% and 20%, and the second material includes at least one of silicon or third SiGe that has a third Ge content between 5% and 30%. In some embodiments, the second Ge content in the second SiGe is at least 15% higher than the third Ge content in the third SiGe.

In the disclosed method, the plurality of bottom S/D regions are formed by depositing a plurality of silicon layers that are doped with boron in the plurality of trenches, where the plurality of silicon layers doped with boron are in direct contact with the plurality of second nano-channels. In addition, the plurality of top S/D regions are formed by depositing a plurality of silicon layers that are doped with phosphorous in the plurality of trenches, where the plurality of silicon layers doped with phosphorous are in direct contact with the plurality of first nano-channels.

The disclosed method further includes removing the intermediate layers that are positioned in each of the plurality of sub-stacks, and forming a plurality of gate structures in each of the plurality of sub-stacks so that each of the plurality of gate structures surrounds the one or more first nano-channels and the one or more second nano-channels in a respective sub-stack.

According to yet another aspect of the disclosure, a semiconductor device is provided. The disclosed device includes a plurality of transistor pairs formed over a substrate, arranged side by side, and coupled to one another, where each of the plurality of transistor pairs includes a n-type transistor and a p-type transistor that are stacked over one another.

The n-type transistor has a first channel region that includes one or more first nano-channels made of a first material with a first stress, where the one or more first nano-channels extend laterally along the substrate, are stacked over the substrate and spaced apart from one another. The p-type transistor has a second channel region that includes one or more second nano-channels made of a second material with a second stress, where the one or more second nano-channels extend laterally along the substrate, are stacked over the substrate and spaced apart from one another. The first channel region of the n-type transistor and the second channel region of the p-type transistor are surrounded by a gate structure respectively.

In the disclosed device, the n-type transistor includes a first source/drain (S/D) region and a second S/D region. The first S/D region and the second S/D region of the n-type transistor are positioned at two ends of the one or more first nano-channels and in direct contact with the one or more first nano-channels. At least one of the first S/D region and the second S/D region of the n-type transistor is coupled to a first channel region of an adjacent n-type transistor. The p-type transistor further includes a first source/drain (S/D) region and a second S/D region. The first S/D region and the second S/D region of the p-type transistor are positioned at two ends of the one or more second nano-channels and in direct contact with the one or more second nano-channels. At least one of the first S/D region and the second S/D region of the p-type transistor is coupled to a second channel region of an adjacent p-type transistor.

In the present disclosure, a novel device structure is provided, where difference materials can be applied to the n-type transistor and the p-type transistor in the CFET devices. The difference materials provide appropriate strains to enhance carriers' mobility in the channel regions of the n-type and p-type transistors respectively. For example, a SiC material can be applied in the channel region of the n-type transistor, which can cause tensile stress to enhance the electrons' mobility in the channel region, and a SiGe material can be applied in the channel region of the p-type transistor which can cause compressive strain to enhance the holes' mobility in the channel region. Accordingly, a more efficient Idsat (saturation current) for NMOS and PMOS can be achieved due to the mobility improvement.

In the disclosed device, building blocks can be created for each CFET for a better optimization of CFET's performance. In a first example, a Si channel can be applied for NMOS, and a SiGe channel for PMOS, which results in a standard performance NMOS, and a high performance PMOS. In a second example, a SiC channel can be applied for NMOS, and a SiGe channel can be applied for PMOS, which results in a high performance NMOS, and a high performance PMOS. In a third example, a SiC channel can be applied for NMOS, and a Si channel can be applied for PMOS, which results in a high performance NMOS, and a standard performance PMOS.

Further, transistor architectures can enable N=1 to N=>10 nano-channel planes of transistors depending on circuit requirements. Different percent of Ge can be used in the nano-channels for etch selectivity for NMOS and PMOS devices. Further, different C content may be used for NMOS nano-channels.

In the present disclosure, a novel method is also provided to fabricate the disclose device. In the disclosed method, an epitaxial layer stack can be formed, where the channel regions of the n-type and p-type transistor can be positioned. The epitaxial layer stack can include a plurality of Si and SiGe layers that have different Ge contents. A SiGe layer with a higher Ge content can be etched faster than a SiGe layer with a lower Ge content. By using such an etch selectivity, SiGe layers with higher Ge content can be removed and leave behind SiGe layers with lower Ge content and Si layers. The SiGe with lower Ge content and Si layers accordingly protrude from side walls of the SiGe with higher Ge content, and function as the channel regions. The disclosed method requires no new mask for process steps (e.g., forming the channel region) as compared to a related CFET process flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
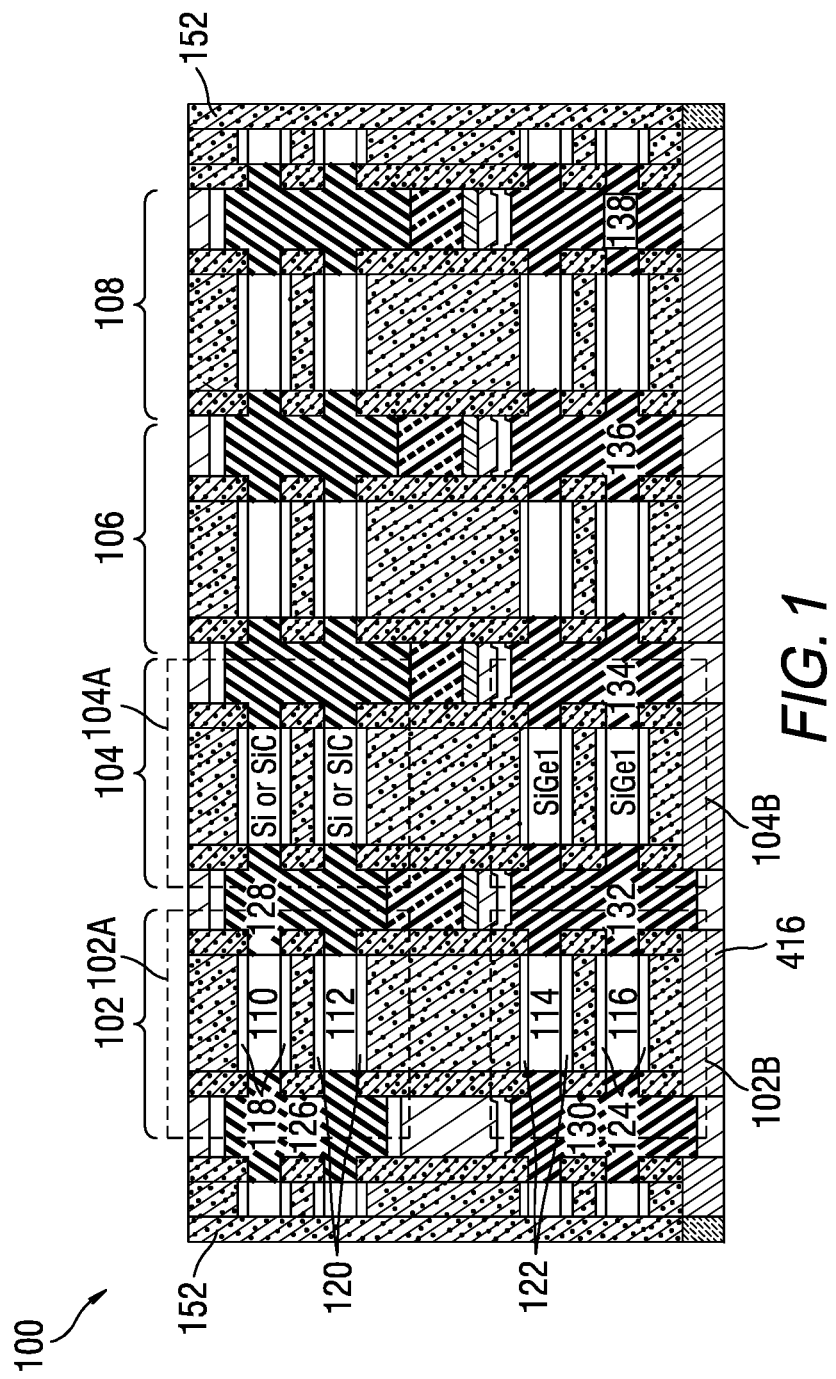
FIG. 1 is a cross-sectional view of a CFET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

The disclosure is related to making 3D transistors using multiple selective nano-channels for fabrication in different device regions (i.e., NMOS, PMOS). By changing the nano-channel material construction, the transistor performance can be increased.

FIG. 1 illustrates a cross-sectional view of a CFET device that has different materials in channel regions. As shown in FIG. 1, a CFET device 100 is provided. The CFET device 100 can include a plurality of transistor pairs formed over a substrate (not shown). For example, four transistor pairs 102-108 can be included in the device 100. Each of the transistor pairs can include a n-type transistor and a p-type transistor that are stacked over one another. In some embodiments, the n-type transistor is positioned over the p-type transistor. In some embodiment, the p-type transistor is positioned over the n-type transistor. In an embodiment of FIG. 1, the n-type transistor is positioned over the p-type transistor. For example, the transistor pair 102 has a n-type transistor 102A and a p-type transistor 102B. The n-type transistor 102A is positioned over the p-type transistor 102B.

In the disclosed device 100, the n-type transistor can have a first channel region that includes a number N of first nano-channels, where the N can be an integer from one to ten. The p-type transistor can have a second channel region that includes a number M of second nano-channels, where the M can be an integer from one to ten. The first and second nano-channels can be formed laterally along a top surface of the substrate (not shown) and arranged in parallel. The first nano-channels can be spaced apart from one another. The second nano-channels can also be spaced apart from one another. For example, as shown in FIG. 1, the n-type transistor 102A can include two first nano-channels 110 and 112 that are spaced apart from each other. The p-type transistor 102B can include two second nano-channels 114 and 116 that are also spaced apart from each other. In some embodiments, the first and second channel regions can be made of different materials. For example, the first channel region can be made of a first material. The first material can include silicon, silicon carbide (SiC), or the like. The silicon carbide can have a carbon content between 2% and 20%. The addition of the carbon in the first channel region can cause tensile stress which in turn enhances the carriers' mobility (e.g., electrons' mobility) in the first channel region. The second channel region can be made of a second material. The second material can include silicon, silicon germanium (SiGe), or the like. The SiGe can have a Ge content between 5% and 30%. The addition of the Ge in the second channel region can cause compressive stress which in turn enhances the carriers' mobility (e.g., holes' mobility) in the second channel region.

The nano-channel herein means either a nano wire or a nano sheet shaped channel for a field effect transistor. A nanowire is a relatively small elongated structure formed having a generally circular cross section or rounded cross section. Nanowires are often formed from layers that are pattern etched to form a channel having a generally square cross-section, and then corners of this square cross-section structure are rounded, such as be etching, to form a cylindrical structure. A nano sheet is similar to a nanowire in that it is a relatively small cross section (less than a micron and typically less than 30 nanometers), but with a cross section that is rectangular. A given nano sheet can include rounded corners.

During at least one point during the formation or processing of a nano-channel (wire or sheet), the given nano-channel is uncovered on all sides, including a bottom side. This differs from "planar" transistor channels which typically have at least one side that is on bulk silicon (or other material) and that always remains covered (another material in contact with it) during microfabrication. Planar channels enable a gate structure to essentially contact one side or two sides or three sides, but not all sides or surfaces. In contrast, nanowires and nano sheets enable gate-all-around (GAA) channels. Thus, a nano-channel herein can have various cross sections, but enables a gate to be formed all around the channel structure.

The n-type transistor can include a first source/drain (S/D) region and a second S/D region that are positioned at two ends of the first channel region and in direct contact with the first channel region. In some embodiments, the first and second S/D regions of the n-type transistor can be made of silicon doped with phosphorous. The p-type transistor can include a first S/D region and a second S/D region that are positioned at two ends of the second channel region and in direct contact with the second channel region. In some embodiments, the first S/D region and the second S/D region of the p-type transistor can be made of silicon doped with boron. For example, as shown in FIG. 1, the n-type transistor 102A can have a first S/D region 126 and a second S/D region 128, which are positioned at two ends of the first nano-channels 110 and 112, and in direct contact with the first nano-channels 110 and 112. The p-type transistor 102B has a first S/D region 130 and a second S/D region 132, which are positioned at two ends of the second nano-channels 114 and 116, and in direction contact with the second nano-channels 114 and 116.

The n-type transistor and the p-type transistor can also have a gate structure respectively. The gate structure can be formed to surround the channel regions. For example, the n-type transistor can have gate structures 118 and 120 that surround the first nano-channels 110 and 112 respectively. The p-type transistor can have gate structures 122 and 124 that surround the second nano-channels 114 and 116 respectively.

In the disclosed device 100, the plurality of transistor pairs can be formed side by side, and coupled to each other. For example, the transistor pair 102 is coupled to the transistor pair 104, where the second S/D region 128 of the n-type transistor 102A in the transistor pair 102 can function as a first S/D region of the n-type transistor 104A in the transistor pair 104, and be coupled to a first channel region of the n-type transistor 104A. Similarly, the second S/D region 132 of the p-type transistor 102B in the transistor pair 102 can function as a first S/D region of the p-type transistor 104B in the transistor pair 104, and be coupled to a second channel region of the p-type transistor 104B.

Figure 2A:
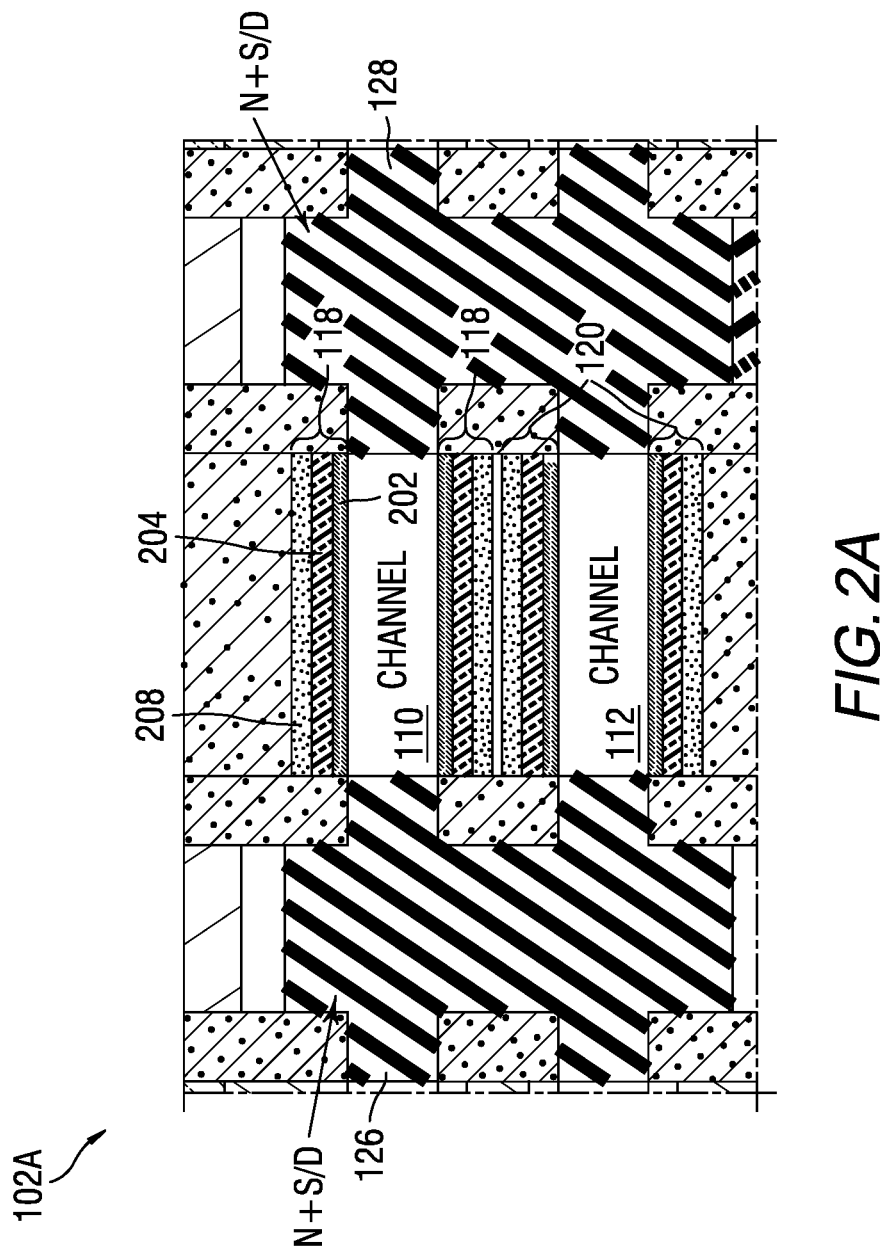
FIG. 2A is an expanded view of a gate structure of a n-type transistor in a CFET device, in accordance with some embodiments.

FIG. 2A is an expanded view of the gate structure of the n-type transistor 102A. As shown in FIG. 2A, the channel region of the n-type transistor 102A can include the two first nano-channels 110 and 112. Each of the first nano-channels can have a respective gate structure that surrounds the nano-channels. For example, the first nano-channel 110 can have a surrounded gate structure 118 and the first nano-channel 112 can have a surrounded gate structure 120. The gate structure 118 can include a first dielectric layer 202 that surrounds the first nano-channel 110 and in direct contact with the first nano-channel 110. The gate structure 118 can have a second dielectric layer 204 that is formed over the first dielectric layer 202. The gate structure 118 can also have a metal gate stack 208 positioned over the second dielectric layer 204. In some embodiments, the first dielectric layer 202 can be an interfacial oxide layer, such as $SiO_2$. The second dielectric layer 204 can be a high-k layer, such as $HfO_2$, and the metal gate stack 208 can include a TiC layer positioned over the second dielectric layer 204.

Figure 2B:
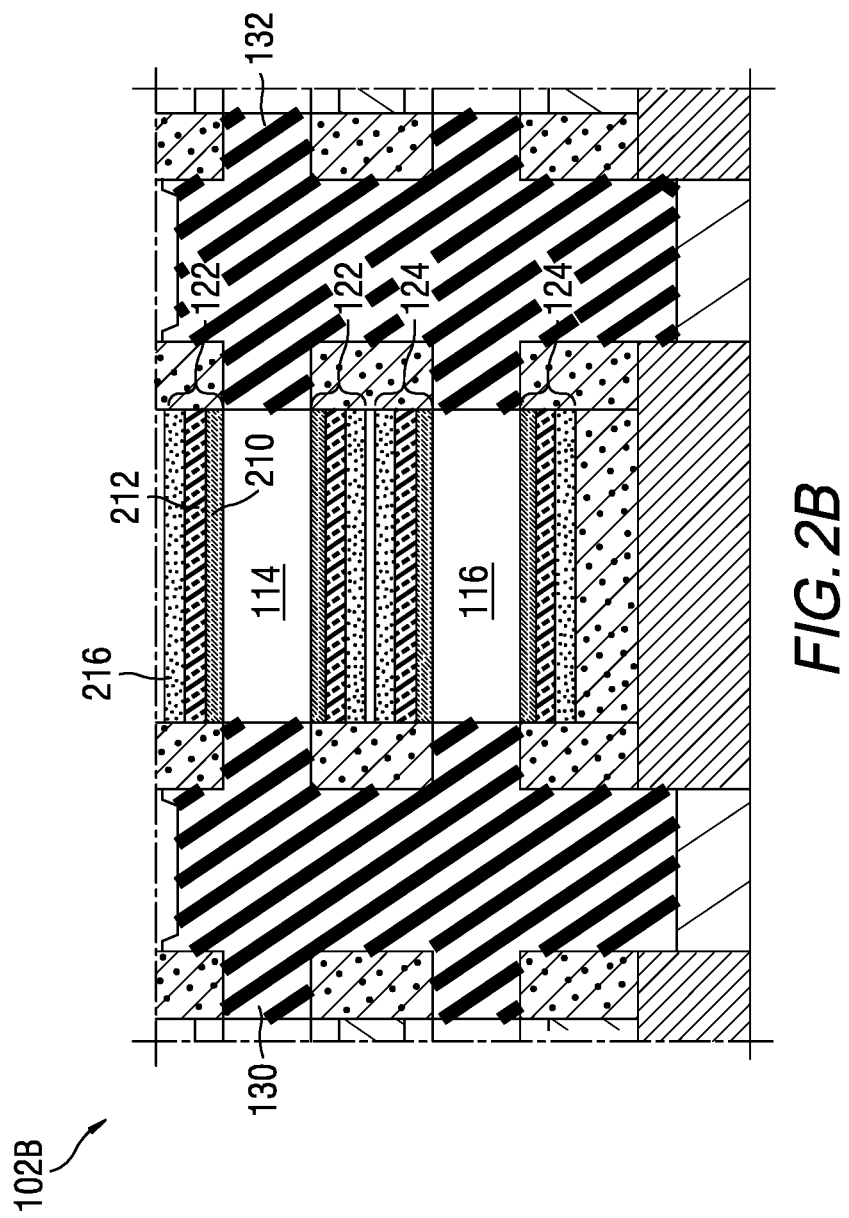
FIG. 2B is an expanded view of a gate structure of a p-type transistor in a CFET device, in accordance with some embodiments.

FIG. 2B is an expanded view of the gate structure of the p-type transistor 102B. As shown in FIG. 2B, the channel region of the p-type transistor 102B can include the two second nano-channels 114 and 116. Each of the second nano-channels can have a respective gate structure that surrounds the second nano-channels. For example, the second nano-channel 114 can have a surrounded gate structure 122 and the second nano-channel 116 can have a surrounded gate structure 124. The gate structure 122 can include a first dielectric layer 210 that surrounds the second nano-channel 114 and in direct contact with the second nano-channel 114. The gate structure 122 can have a second dielectric layer 212 that is formed over the first dielectric layer 210. The gate structure 122 can also have a metal gate stack 216 positioned over the second dielectric layer 212. In some embodiments, the first dielectric layer 210 can be an interfacial oxide layer, such as $SiO_2$. The second dielectric layer 212 can be a high-k layer, such as $HfO_2$, $Al2O_3$, $Y_2O_3$, $ZrO_2$, or the like. The metal gate stack 216 can include a TiC layer positioned over the second dielectric layer 212, a TaN layer positioned over the TiN layer, a TiON layer positioned over the TaN layer, and a TiC layer positioned over the TaN layer.

It should be noted that FIGS. 2A and 2B are merely examples of the gate structures in the device 100. The gate structures can further include gate electrodes. The gate electrodes can include a TiN liner formed over the metal gate stack, and a conductive layer (e.g., tungsten, cobalt) formed over the TiN liner. In addition, the gate structures can include less or more layers than the layers illustrated in FIGS. 2A and 2B according to the device designs.

Figure 3:
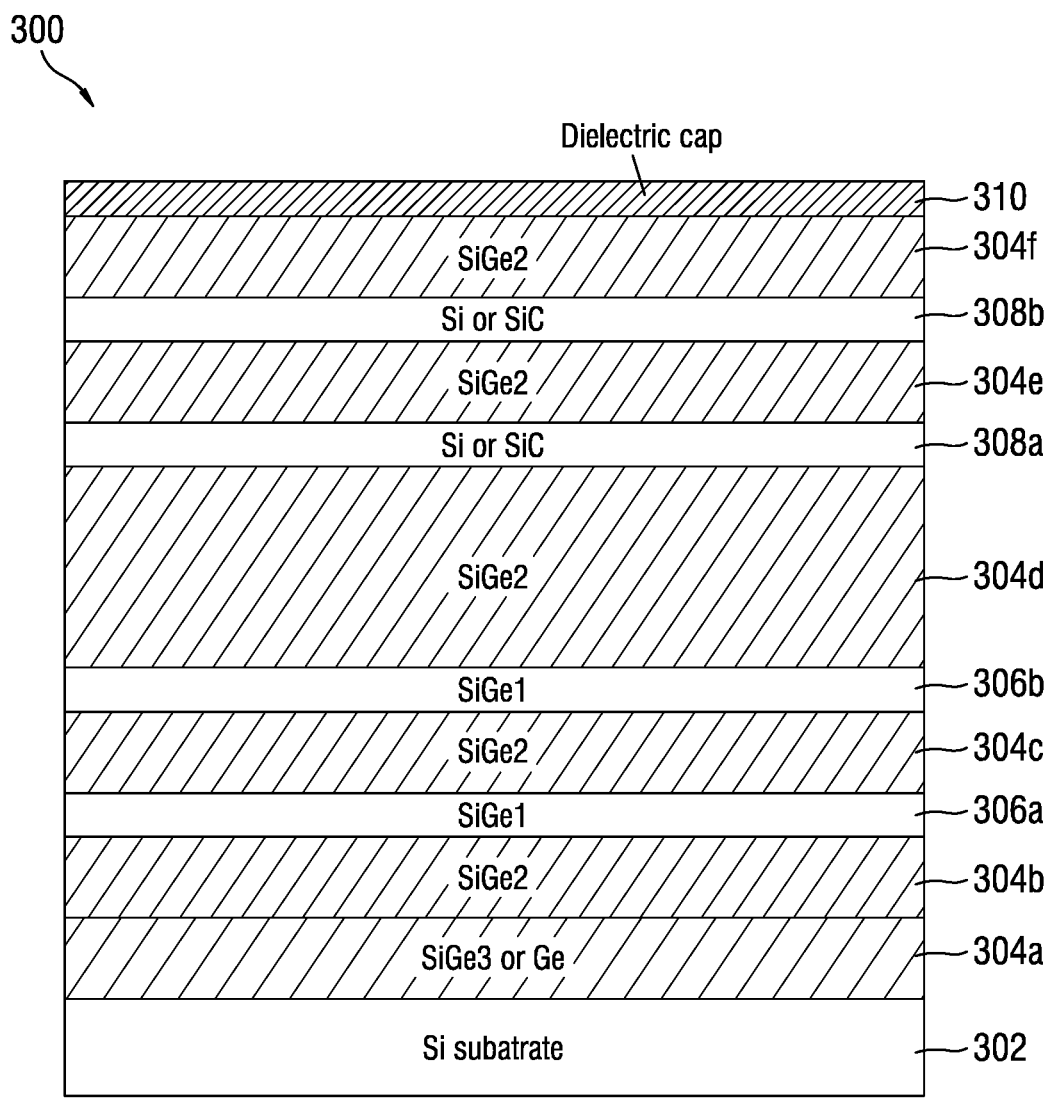
FIGS. 3-8 are cross-sectional views of various exemplary intermediate steps of manufacturing a CFET device, in accordance with some embodiments.

FIGS. 3-8 are cross-sectional views of various exemplary intermediate steps of manufacturing a CFET device, in accordance with some embodiments. As shown in FIG. 3, an epitaxial layer stack 300 can be formed over a substrate 302. The epitaxial layer stack 300 can include a plurality of intermediate layers 304a-304f, one or more first nano layers 308a-308b and one or more second nano layers 306a-306b. The first nano layers 308a-308b can be positioned over the second nano layers 306a-306b and spaced apart from the second nano layers by one or more of the intermediate layers. For example, the first nano layers 308a-308b and the second nano layers 306a-306b are separated by an intermediate layer 304d. The first nano layers can made of a first material with a first stress and spaced apart from one another by one or more of intermediate layers. As shown in FIG. 3, the first nano layers 308a-308b are spaced apart from one another by an intermediate layer 304e. The second nano layers 306a-306b can be made of a second material with a second stress and spaced apart from one another by one or more intermediate layers. For example, as shown in FIG. 3, the second nano layers 306a-306b are separated by an intermediate layer 304c.

The first material can include silicon or silicon carbide (SiC) that has a tensile stress. The SiC can include a carbon content between 2% and 20%. The second material can include silicon, or SiGe1 that has a compressive stress and includes a Ge content between 5% and 30%. In some embodiment, the intermediate layers can include a bottom layer positioned on the substrate and a plurality of upper layers positioned over the bottom layer. As shown in FIG. 3, a bottom layer 304a can be formed on the substrate 302. The bottom layer can be made of SiGe3 that includes a Ge content between 80% and 100%. When the Ge content is 100%, the bottom layer is actually made of Ge. A plurality of upper layers 304b-304f can be positioned over the bottom layer 304a. The upper layers 304b-304f can be made of SiGe2 that includes a Ge content between 60% and 80%. In some embodiments, the epitaxial layer stack 300 can further include an oxide cap layer 310 that is configured to protect the underlying layers during the subsequent manufacturing processes.

In a first example, the SiGe1 can have a Ge content from 10% to 45%, the SiGe2 can have a Ge content from 35% to 75%, and the SiGe3 can have a Ge content from 50% to 100%. In a second example, the SiGe1 can have a Ge content from 25% to 35%, the SiGe2 can have a Ge content from 55% to 65%, and the SiGe3 can have a Ge content from 75% to 100%. In a third example, when the first and second nano-channels are made of Si, the bottom layer of the intermediate layers can be made of SiGe2, and upper layers of the intermediate layers can be made of SiGe1. Accordingly, the SiGe1 can have a Ge content from 25% to 45%, and the SiGe2 can have a Ge content from 55% to 75%. In some embodiments, the Ge content in the SiGe2 is at least 15% higher than the Ge content in the SiGe1 in order to achieve a desired etch selectivity.

Any suitable method can be applied to form the epitaxial layer stack 300. For example, the method can include chemical vapor deposition (CVD), physical vapor deposition (PVD), diffusion, atomic layer deposition (ALD), low pressure CVD, or other suitable deposition methods.

Figure 4:
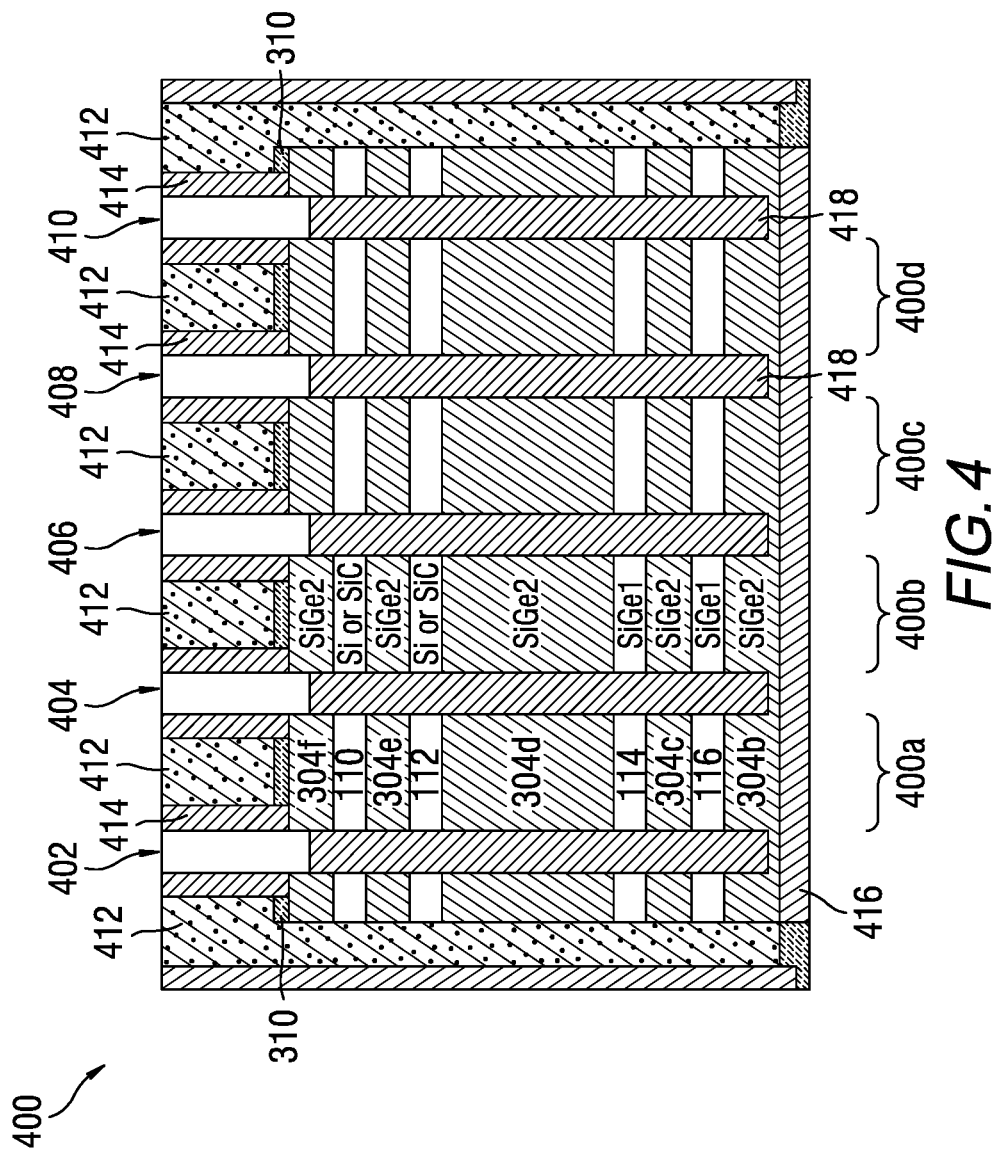

In FIG. 4, a plurality of trenches can be formed in the epitaxial layer stack 300 through a patterning technique. The patterning technique can include a photolithography process and an etching process. The photolithography process can form a mask stack on the epitaxial layer stack, and further form a plurality of patterns in the mask stack. The etching process can transfer the patterns into the epitaxial layer stack to form the plurality of trenches. As shown in FIG. 4, five trenches 402-410 can be formed in the epitaxial layer stack 300. The epitaxial layer stack 300 can be separated into a plurality of sub-stacks 400a-400d by the trenches 402-410 so that the first nano layers 308a-308b are separated into a plurality of first nano-channels (e.g., 110, 112), the second nano layers 306a-306b are separated into a plurality of second nano-channels (e.g., 114 and 116), and each of the sub-stacks includes one or more first nano-channels and one or more second nano-channels. For example, the sub-stack 420a can include two first nano-channels 110 and 112, and two second nano-channels 114 and 116. Moreover, two ends of the nano-channels can be exposed in the trenches.

Figure 5:
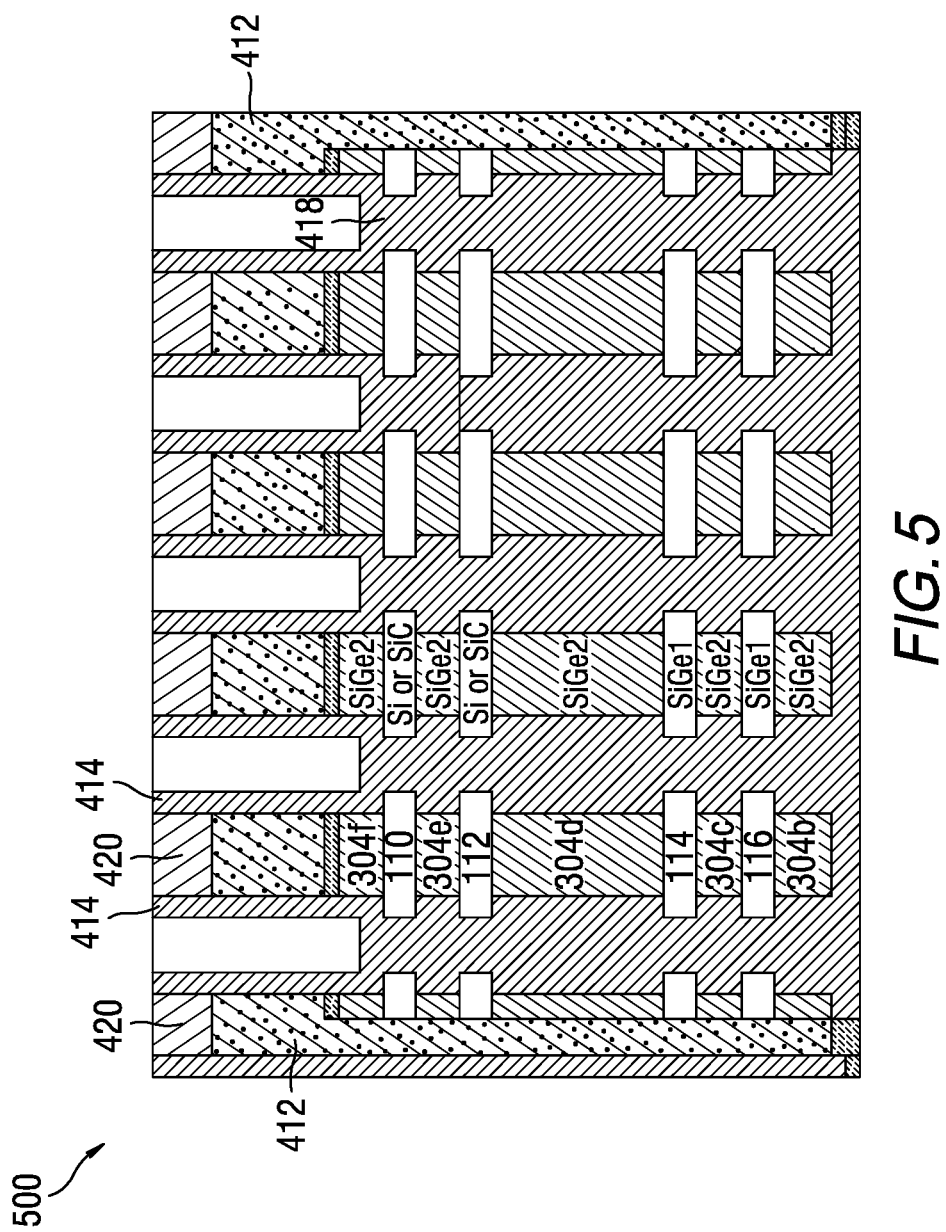

Still referring to FIG. 4, the mask stack can include an amorphous Si (a-Si) layer 412 that is positioned over the oxide cap layer 310, a SiN layer (420, as shown in FIG. 5) and a resist layer (not shown). A plurality of spacers 414 can be formed along sidewalls of the a-Si layer 412. In addition, a plurality of inner spacers 418 can be formed in the trenches. Moreover, it should be noted that the bottom layer 304a can be removed and replaced with an oxide layer 416. In some embodiment, the spacers 414 can be an oxide layer, such as $SiO_2$, and the inner spacer 418 and the oxide layer 416 can also be made of $SiO_2$.

In FIG. 5, the plurality of intermediate layers 304b-304f can be recessed by an etching process, such as a dry etch process or a wet etch process. As mentioned above, the intermediate layers have a higher Ge content than the first nano-channels or the second nano-channels. The intermediate layers that have a higher Ge content can have a faster etch rate than the first and second nano-channels that have a lower Ge content. When the etching process is completed, a portion of the intermediate layers can be removed, and sidewalls of the intermediate layers can be accordingly recessed. The first/second nano-channels can be etched during the etching process, but removal amount can be very little. Accordingly, the first nano-channels and second nano-channels in each of sub-stacks can protrude from the sidewalls of the intermediate layers. For example, the first nano-channels 110 and 112 can protrude from sidewalls of the intermediate layers 304d-304f, and the second nano-channels 114 and 116 can protrude from sidewalls of the intermediate layers 304b-304d.

Figure 6:
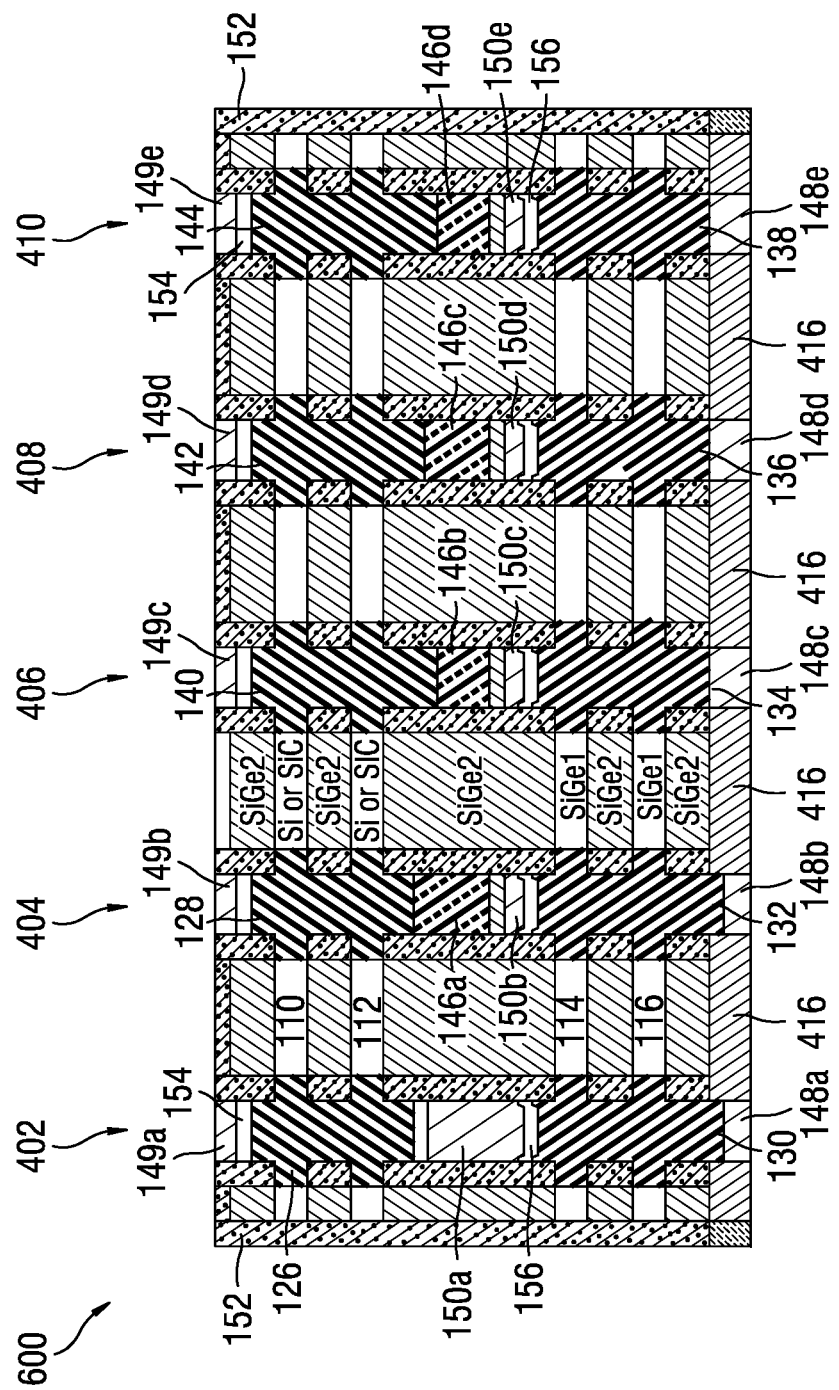

In FIG. 6, a plurality of bottom source/drain (S/D) regions 130-138 can be formed in the trenches 402-410. The bottom S/D regions 130-138 can be in direct contact with the second nano-channels and function as S/D regions of the p-type transistors. For example, the S/D regions 130 and 132 can be the first S/D region 130 and the second S/D region 132 of the p-type transistor 102B that is shown in FIG. 1. When the bottom S/D drains are formed, a plurality of top source/drain (S/D) regions 126, 128, and 140-144 can be formed in the plurality of trenches. The top S/D regions can be in direct contact with the first nano-channels and function as S/D regions of the n-type transistors. For example, the top S/D regions 126 and 128 can be the first S/D region 126 and the second S/D region 128 of the n-type transistor 102A that is shown in FIG. 1.

Any suitable method can be applied to form the bottom and top S/D regions. For example, the method can include chemical vapor deposition (CVD), physical vapor deposition (PVD), diffusion, atomic layer deposition (ALD), low pressure CVD, or other suitable deposition methods. In some embodiments, the bottom S/D regions can be made of silicon doped with boron, and the top S/D regions can be made of silicon doped with phosphorous.

Still referring to FIG. 6, a plurality of local interconnects 146a-146d can be formed in over the bottom S/D regions. The local interconnects can be coupled to the bottom S/D regions or the top S/D regions according to the circuit designs. In addition, a plurality of bottom oxide layers 148a-148e can be formed between the bottom S/D regions and the substrate (not shown), a plurality of top oxide layers 149a-149e can be formed over the top S/D regions, and a plurality of middle oxide layers 150a-150e can be positioned between the bottom and top S/D regions to separate the bottom and top S/D regions from each other. It should be noted that during the formation of the bottom and top S/D regions, the inner spacer 418 can be removed and an oxide layer 152 can be formed when the formation of the bottom and top S/D regions are completed. In addition, a plurality bottom cap layers 156 can be formed over the bottom S/D regions, and a plurality of top cap layer 154 can be formed over the top S/D regions to prevent the dopant loss. In some embodiments, the cap layers 154 and 156 can be made of oxide or nitride, and formed by a selectively ALD deposition.

Figure 7:
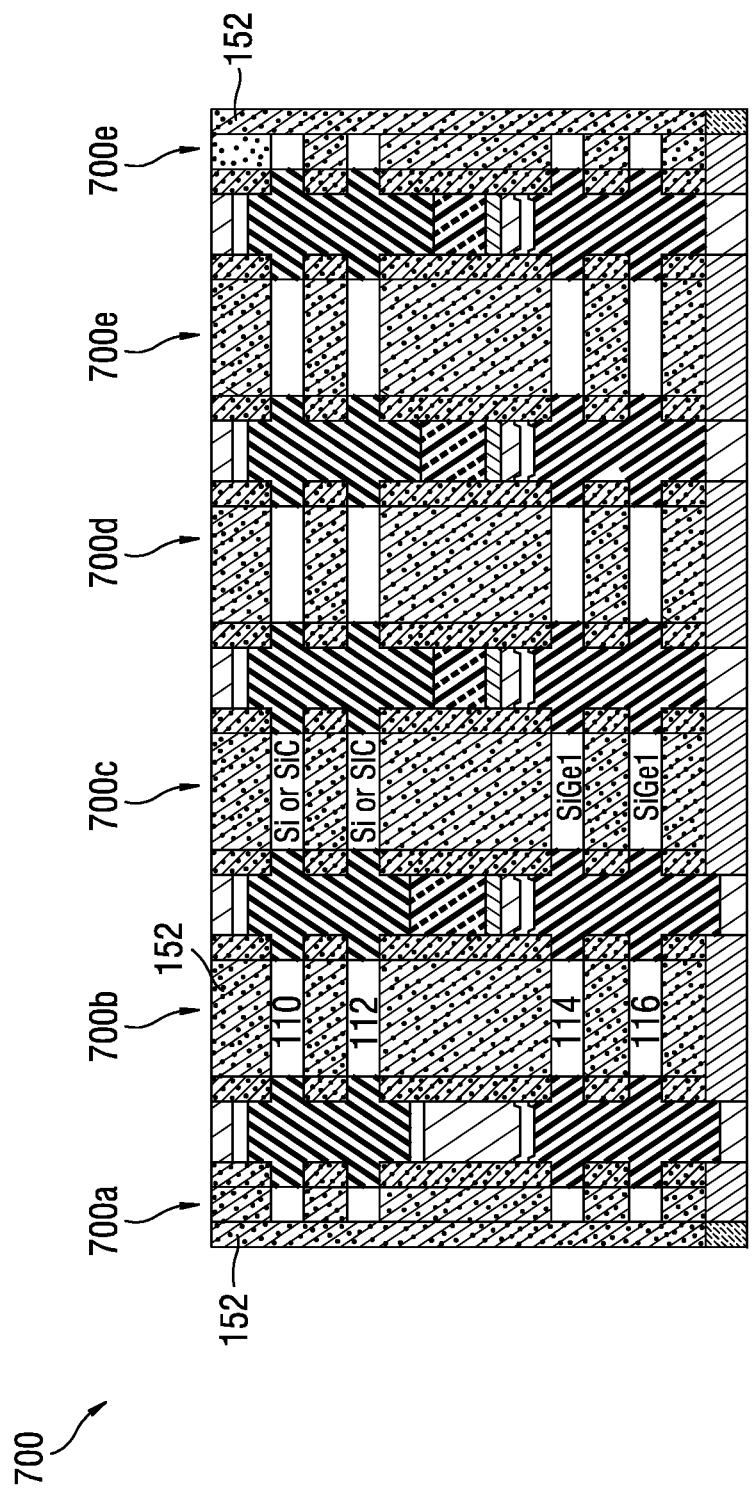

In FIG. 7, an etching process can be applied to remove the intermediate layers so that a plurality of trenches 700a-700f can be formed. When the trenches 700 are formed, the first nano-channels and the second nano-channels are exposed in the trenches 700 accordingly. The etching process can be a dry etch process or a wet etch process. The etching process can be a selective etching that preferably remove the intermediate layers and etch the first/second nano-channels in a very little amount. As mentioned above, the intermediate layers can be made of a SiGe2, the first nano-channels can be made of Si or SiC, and the second nano-channels can be made of SiGe1, where the SiGe2 has a higher Ge content than the SiGe1. The Ge content difference can result in a good etch selectivity so that the etch rate of the SiGe2 is higher than that of the Si, SiC or SiGe1. Accordingly, a selective removal of the intermediate layers can be obtained.

Figure 8:
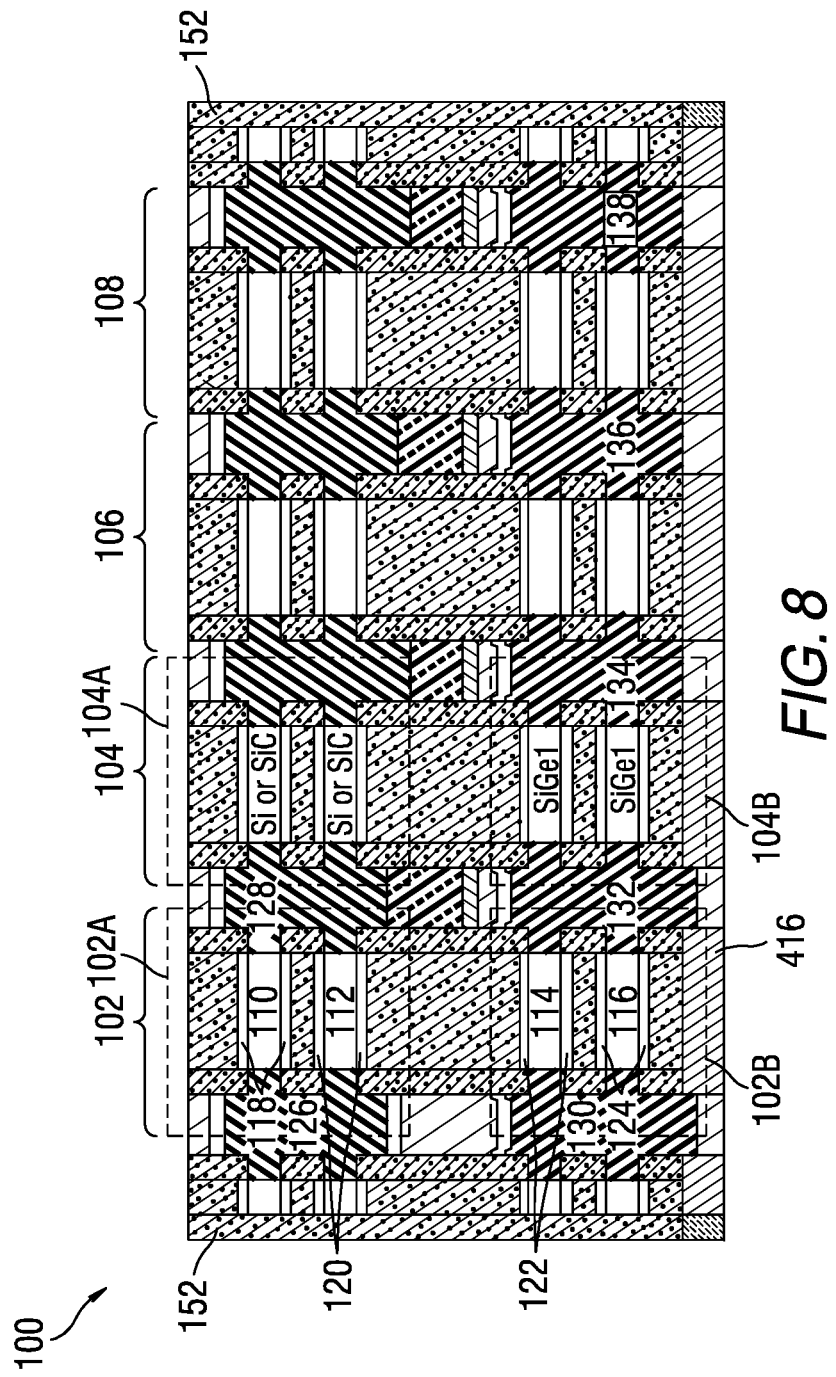

In FIG. 8, a plurality of gate structures, such as the gate structures 118-124, can be formed by depositing a plurality of dielectric layers and a metal gate stack into the trenches 700. The dielectric layers and the metal stack can be deposited to surround the first/second nano-channels and function as the gate structures. Similar to FIGS. 2A and 2B, the dielectric layers can include a first dielectric layer that is formed on the nano-channels, a second dielectric layer that is formed over the first dielectric layer. The metal gate stack can include one or more conductive layers and be positioned over the second dielectric layer. The dielectric layers and the metal stack can be formed by a CVD process, a PVD process, an ALD process, a diffusion process, a sputtering process, or other suitable processes.

Once the formation of the gate structures are completed, the CFET device 100 that is illustrated in FIG. 1 can be formed in FIG. 8. It should be noted that additional steps can be provided. For example, a plurality of gate electrodes (not shown) can be formed in the trenches. The gate electrodes can surround the gate structures and further be coupled to additional interconnect structures (e.g., metallization layers having conductive lines and/or vias). Such interconnect structures electrically connect the semiconductor device 100 with other contact structures and/or active devices to form functional circuits. Additional device features such as passivation layers, input/output structures, and the like may also be formed.

The various embodiments described herein offer several advantages over related examples. For example, difference materials can be applied to the n-type transistor and the p-type transistor in the CFET devices. The difference materials provide appropriate strains to enhance carriers' mobility in the channel regions of the n-type and p-type transistors respectively. In addition, in order to form the CFET devices, an epitaxial layer stack can be formed. The epitaxial layer stack can include a plurality of Si and SiGe layers that have different Ge contents. A SiGe layer with a higher Ge content can be etched faster than a SiGe layer with a lower Ge content. By using such an etch selectivity, SiGe layers with high Ge content can be removed and leave behind SiGe layers with lower Ge content and Si layers. The SiGe with lower Ge content and Si layers accordingly protrude from side walls of the SiGe with higher Ge content, and function as the channel regions. The disclosed method requires no new mask for process steps (e.g., forming the channel regions) as compared to a related CFET process flow.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming a semiconductor device, comprising:
    forming an epitaxial layer stack over a substrate, the epitaxial layer stack including a plurality of intermediate layers, one or more first nano layers and one or more second nano layers that are positioned below the one or more first nano layers and spaced apart from the one or more first nano layers by the plurality of intermediate layers, the one or more first nano layers being made of a first material with a first stress and spaced apart from one another by the plurality of intermediate layers, the one or more second nano layers being made of a second material with a second stress and spaced apart from one another by the plurality of intermediate layers;

forming a plurality of trenches in the epitaxial layer stack, the epitaxial layer stack being separated into a plurality of sub-stacks by the plurality of trenches so that the one or more first nano layers are separated into a plurality of first nano-channels, the one or more second nano layers are separated into a plurality of second nano-channels, and each of the plurality of sub-stacks includes one or more first nano-channels of the plurality of first nano-channels and one or more second nano-channels of the plurality of second nano-channels;

recessing the plurality of intermediate layers so that the one or more first nano-channels and the one or more second nano-channels in each of the plurality of sub-stacks protrude from sidewalls of the plurality of intermediate layers;

forming a plurality of bottom source/drain (S/D) regions in the plurality of trenches, the plurality of bottom S/D regions being in contact with the plurality of second nano-channels; and forming a plurality of top S/D regions in the plurality of trenches, the plurality of bottom S/D regions being in contact with the plurality of first nano-channels.

2. The method of claim 1, wherein the plurality of intermediate layers comprises:
a bottom layer that are positioned on the substrate and made of first SiGe, the first SiGe having a first Ge content between 80% and 100%; and
a plurality of upper layers that are positioned over the bottom layer, and made of second SiGe that includes a second Ge content between 60% and 80%.

3. The method of claim 2, wherein the first material comprises one of silicon and silicon carbide that includes a carbon content between 2% and 20%, and the second material comprises one of silicon and third SiGe that includes a third Ge content between 5% and 30%.

4. The method of claim 3, wherein the second Ge content in the second SiGe is at least 15% higher than the third Ge content in the third SiGe.

5. The method of claim 1, wherein forming the plurality of bottom S/D regions comprises depositing a plurality of silicon layers that are doped with boron in the plurality of trenches, the plurality of silicon layers doped with boron being in direct contact with the plurality of second nano-channels.

6. The method of claim 1, wherein forming the plurality of top S/D regions comprises depositing a plurality of silicon layers that are doped with phosphorous in the plurality of trenches, the plurality of silicon layers doped with phosphorous being in direct contact with the plurality of first nano-channels.

7. The method of claim 1, further comprising:
removing the intermediate layers that are positioned in each of the plurality of sub-stacks; and
forming a plurality of gate structures in each of the plurality of sub-stacks so that each of the one or more first nano-channels and each of the one or more second nano-channels being surrounded by a gate structure in a respective sub-stack.

8. The method of claim 1, wherein the first stress comprises a tensile stress and the second stress comprises a compressive stress.

9. A semiconductor device, comprising:
a plurality of bottom transistor pairs formed over a substrate, arranged side by side, and coupled to one another, each of the plurality of bottom transistor pairs including a n-type transistor and a p-type transistor that are stacked over one another, wherein:
the n-type transistor has a first channel region that includes one or more first nano-channels with a first stress, the one or more first nano-channels extending laterally along the substrate, being stacked over the substrate and spaced apart from one another;
the p-type transistor has a second channel region that includes one or more second nano-channels with a second stress, the one or more second nano-channels extending laterally along the substrate, being stacked over the substrate and spaced apart from one another;
each of the one or more first nano-channels in the first channel region of the n-type transistor and each of the one or more second nano-channels in the second channel region of the p-type transistor are surrounded by a gate structure respectively;
the n-type transistor includes a first source/drain (S/D) region and a second S/D region, the first S/D region and the second S/D region of the n-type transistor being positioned at two ends of the one or more first nano-channels and in direct contact with the one or more first nano-channels, at least one of the first S/D region and the second S/D region of the n-type transistor being coupled to a first channel region of an adjacent n-type transistor; and
the p-type transistor further comprises a first S/D region and a second S/D region, the first S/D region and the second S/D region of the p-type transistor being positioned at two ends of the one or more second nano-channels and in direct contact with the one or more second nano-channels, at least one of the first S/D region and the second S/D region of the p-type transistor being coupled to a second channel region of an adjacent p-type transistor.

10. The semiconductor device of claim 9, wherein the first stress comprises a tensile stress and the second stress comprises a compressive stress.

11. The semiconductor device of claim 9, wherein the one or more first nano-channels are made of silicon carbon (SiC) with a carbon content between 2% and 20%.

12. The semiconductor device of claim 9, wherein the one or more second nano-channels are made of silicon germanium (SiGe) with a germanium content between 5% and 30%.

13. The semiconductor device of claim 9, further comprising:
a plurality of top transistor pairs positioned over the plurality of bottom transistor pairs, arranged side by side, and coupled to one another, each of the plurality of top transistor pairs including a n-type transistor and a p-type transistor that are stacked over one another, wherein:
each of the plurality of top transistor pairs is positioned over a respective bottom transistor pair of the plurality of bottom transistor pairs.

14. The semiconductor device of claim 13, wherein:
the n-type transistor has a n-type channel region that includes one or more n-type nano-channels with the first stress, the one or more n-type nano-channels extending laterally along the substrate, being stacked over the substrate and spaced apart from one another, and the p-type transistor has a p-type channel region that includes one or more p-type nano-channels with the second stress, the one or more p-type nano-channels extending laterally along the substrate, being stacked over the substrate and spaced apart from one another.

\* \* \* \* \*